US012642138B2

(12) United States Patent
Agarwal et al.

(10) Patent No.: US 12,642,138 B2
(45) Date of Patent: May 26, 2026

(54) THREE DIMENSIONAL APPLICATION-SPECIFIC INTEGRATED CIRCUIT ARCHITECTURE

(71) Applicant: META PLATFORMS, INC., Menlo Park, CA (US)

(72) Inventors: Ravi Shankar Agarwal, Los Altos, CA (US); Kaushal Gandhi, South San Francisco, CA (US); Bhasker Reddy Jakka, Fremont, CA (US); Harikrishna Madadi Reddy, San Jose, CA (US); Baheerathan Anandharengan, Milpitas, CA (US); Christian Markus Petersen, Golden, CO (US); Olivia Wu, Los Altos, CA (US); Mahesh Srinivasa Maddury, San Jose, CA (US); Pankaj Kansal, Fremont, CA (US)

(73) Assignee: META PLATFORMS, INC., Menlo Park, CA (US)

( * ) Notice: Subject to any disclaimer, the term of this patent is extended or adjusted under 35 U.S.C. 154(b) by 589 days.

(21) Appl. No.: 18/096,516

(22) Filed: Jan. 12, 2023

(65) Prior Publication Data

US 2024/0243112 A1     Jul. 18, 2024

(51) Int. Cl.
*H10W 90/00*     (2026.01)
*H10B 80/00*     (2023.01)
(Continued)

(52) U.S. Cl.
CPC ............ *H10W 90/00* (2026.01); *H10B 80/00* (2023.02); *H10W 20/20* (2026.01); *H10W 72/952* (2026.01); *H10W 90/792* (2026.01)

(58) Field of Classification Search
CPC ....... H01L 25/16; H01L 23/481; H01L 24/05; H01L 24/08; H10W 90/00; H10W 20/20; H10W 72/952; H10B 80/00
See application file for complete search history.

(56) References Cited

U.S. PATENT DOCUMENTS 10,522,506 B2 * 12/2019  Kim .................... H10W 70/611
10,720,408 B2 * 7/2020  Kim .................... H10W 70/611
(Continued)

FOREIGN PATENT DOCUMENTS

CN      106898603 B  * 11/2021  ........... H01L 25/105
CN      116705781 A  * 9/2023  ........... H01L 23/481
(Continued)

OTHER PUBLICATIONS

International Preliminary Report on Patentability for International Application No. PCT/US2023/085151, mailed Jul. 24, 2025, 12 pages.
(Continued)

*Primary Examiner* — Laura M Menz
(74) *Attorney, Agent, or Firm* — EVERSHEDS SUTHERLAND (US) LLP

(57)     ABSTRACT

Three-dimensional application specific integrated circuit (IC) architecture is described herein. In one aspect, an IC may include a first die including: a first semiconductor layer; a plurality of processing elements (PEs) located on the first semiconductor layer; and a first interface region of the first semiconductor layer, electrically coupled to the plurality of PEs and configured to communicate electrical signals with the plurality of PEs; a second die including: a second semiconductor layer; a plurality of IC elements located on the second semiconductor layer; and a second interface region of the second semiconductor layer, electrically coupled to the plurality of IC elements and configured to communicate electrical signals to the plurality of IC ele-
(Continued)

ments, where the first interface region and the second interface region are electrically coupled to each other and configured to transmit electrical signals between the plurality of PEs and the plurality of IC elements.

16 Claims, 5 Drawing Sheets

(51) Int. Cl.
    *H10W 20/20*        (2026.01)
    *H10W 72/90*        (2026.01)

(56)                References Cited

U.S. PATENT DOCUMENTS

| | | | | |
|---|---|---|---|---|
| 11,437,114 | B1 * | 9/2022 | Vijayrao | G11C 29/12015 |
| 11,616,046 | B2 * | 3/2023 | Lin | H03K 19/1776 257/774 |
| 11,658,158 | B2 * | 5/2023 | Huang | H10W 90/00 257/777 |
| 11,990,199 | B2 * | 5/2024 | Song | G11C 29/42 |
| 12,113,051 | B2 * | 10/2024 | Huang | H10W 90/00 |
| 12,327,816 | B2 * | 6/2025 | Lin | H03K 19/1776 |
| 2017/0179079 | A1 * | 6/2017 | Kim | H10W 70/611 |
| 2020/0083195 | A1 * | 3/2020 | Kim | H10W 70/611 |
| 2020/0144224 | A1 * | 5/2020 | Lin | H03K 19/1776 |
| 2021/0098407 | A1 * | 4/2021 | Elsherbini | H10D 84/01 |
| 2021/0305678 | A1 * | 9/2021 | Huang | H01Q 1/2283 |
| 2022/0068888 | A1 * | 3/2022 | Huang | H10W 90/00 |
| 2022/0230698 | A1 * | 7/2022 | Song | G11C 29/42 |
| 2022/0375898 | A1 * | 11/2022 | Pandit | H10W 90/00 |
| 2023/0028475 | A1 * | 1/2023 | Nalamalpu | H03K 19/1776 |
| 2023/0215839 | A1 * | 7/2023 | Lin | H03K 19/1776 257/737 |
| 2023/0260970 | A1 * | 8/2023 | Huang | H10W 90/00 257/777 |
| 2024/0243112 | A1 * | 7/2024 | Agarwal | H10W 90/00 |
| 2024/0347123 | A1 * | 10/2024 | Song | G11C 29/42 |
| 2024/0387471 | A1 * | 11/2024 | Liu | H10W 90/00 |
| 2025/0062241 | A1 * | 2/2025 | Mun | H10B 80/00 |
| 2025/0079362 | A1 * | 3/2025 | Jee | H10W 90/00 |
| 2025/0149504 | A1 * | 5/2025 | Lin | H03K 19/1776 |
| 2025/0149505 | A1 * | 5/2025 | Lin | H03K 19/1776 |
| 2025/0239574 | A1 * | 7/2025 | Bhushan | H10W 70/095 |
| 2025/0253290 | A1 * | 8/2025 | Lin | H03K 19/1776 |
| 2025/0323125 | A1 * | 10/2025 | Bhushan | H10W 20/20 |

FOREIGN PATENT DOCUMENTS

| | | | | | |
|---|---|---|---|---|---|
| CN | 119542297 | A | * | 2/2025 | H01L 23/3128 |
| EP | 4287248 | A1 | * | 12/2023 | H01L 25/50 |
| JP | 2025036269 | A | * | 3/2025 | H01L 23/3128 |
| KR | 20240148622 | A | * | 10/2024 | H01L 22/32 |
| KR | 20250027414 | A | * | 2/2025 | H01L 23/5389 |
| KR | 20250033517 | A | * | 3/2025 | H01L 23/3128 |
| KR | 102803670 | B1 | * | 5/2025 | H01L 25/50 |
| TW | 202042097 | A | * | 11/2020 | H01L 25/18 |
| TW | 202228267 | A | * | 7/2022 | H10D 1/20 |
| TW | I809218 | B | * | 7/2023 | H01L 25/18 |
| TW | 202335214 | A | * | 9/2023 | H01L 25/165 |
| TW | 202340995 | A | * | 10/2023 | H01L 25/18 |
| TW | I838281 | B | * | 4/2024 | H01L 25/18 |
| TW | 202418543 | A | * | 5/2024 | H01L 25/18 |
| TW | 202512417 | A | * | 3/2025 | H01L 23/3128 |
| WO | WO-2023076842 | A1 | * | 5/2023 | H10B 80/00 |
| WO | WO-2023163954 | A1 | * | 8/2023 | H01L 25/071 |
| WO | WO-2024151402 | A1 | * | 7/2024 | H01L 24/08 |
| WO | WO-2025170780 | A1 | * | 8/2025 | H01L 25/50 |
| WO | WO-2025208140 | A1 | * | 10/2025 | H01L 25/18 |

OTHER PUBLICATIONS

International Search Report and Written Opinion for International Application No. PCT/US2023/085151, mailed Apr. 29, 2024, 15 pages.

* cited by examiner

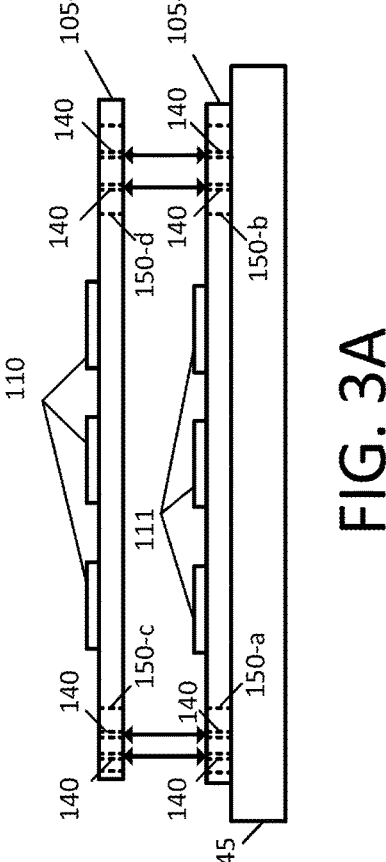

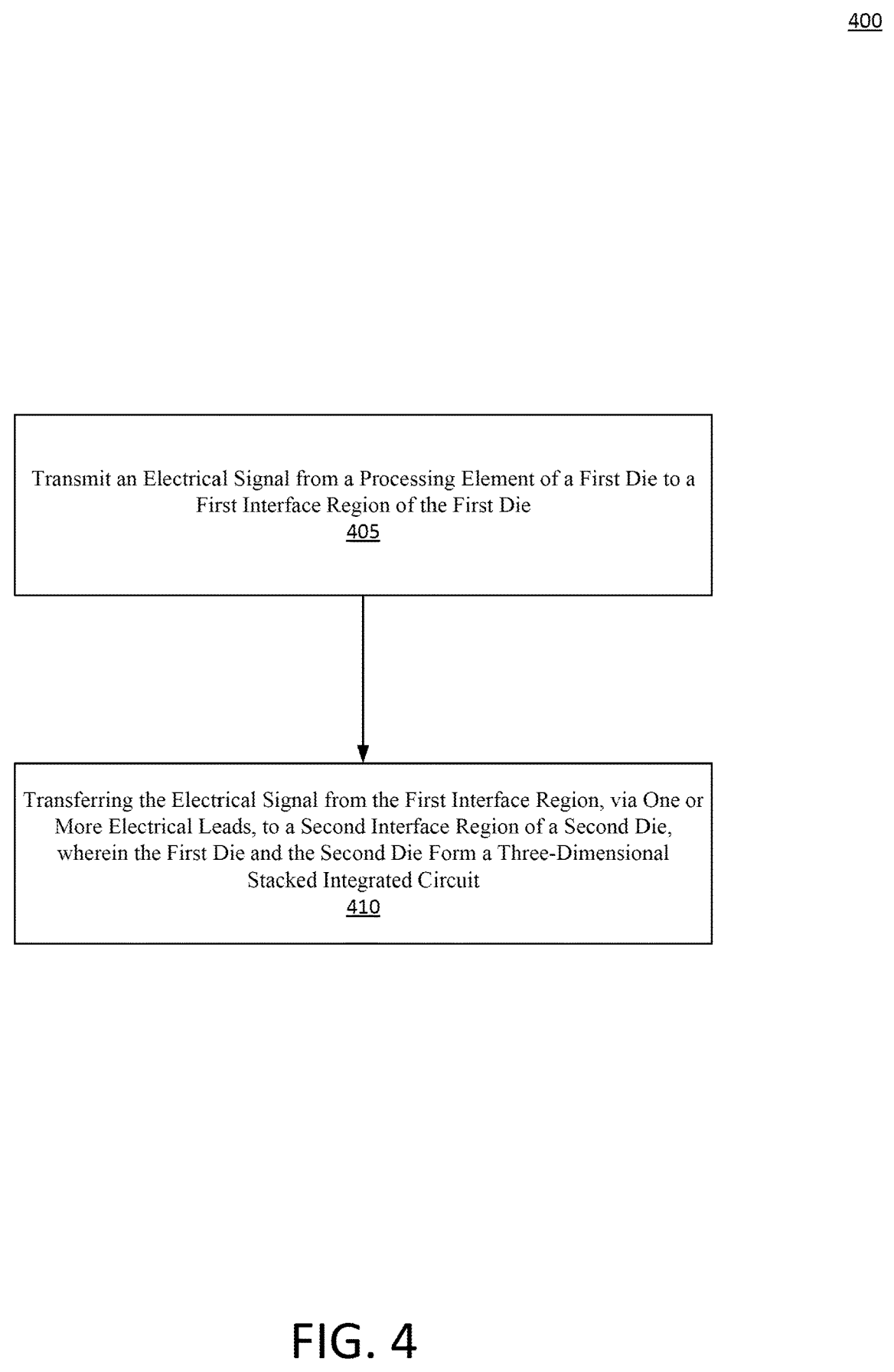

400

Transmit an Electrical Signal from a Processing Element of a First Die to a
First Interface Region of the First Die
405

Transferring the Electrical Signal from the First Interface Region, via One or
More Electrical Leads, to a Second Interface Region of a Second Die,
wherein the First Die and the Second Die Form a Three-Dimensional
Stacked Integrated Circuit
410

FIG. 4

THREE DIMENSIONAL APPLICATION-SPECIFIC INTEGRATED CIRCUIT ARCHITECTURE

TECHNOLOGICAL FIELD

Examples of this disclosure relate generally to methods, apparatuses and computer program products for providing three-dimensional application specific integrated circuit architecture.

BACKGROUND

For integrated circuits, electronic circuits may be fabricated on a semiconductor die, which may form a chip or chiplet. Each chip or chiplet may include one or more processing elements capable of performing specified functions on a given set of data or information.

Typically, the more processing elements a chip has, the more processing power the chip is capable of. However, conventional techniques to add processing power to a chip is limited. For example, in a two-dimensional approach, additional processing elements may be added along the width and length dimensions of the die. This two-dimensional approach is limited due to the size constraints (e.g., area) of a die, particularly for microelectronic technologies. In another approach, multiple stacked circuits may share a common a semiconductive interposer on a die, which may carry communications between circuits. While this approach allows for limiting the length and width of a chip set, the use of the interposer may limit the speed at which communications may travel between the processing elements across different dies.

BRIEF SUMMARY

This summary is provided to introduce a selection of concepts in a simplified form that are further described below in the Detailed Description. This Summary is not intended to limit the scope of the claimed subject matter. The foregoing needs are met, to a great extent, by the present application described in more detail below.

Three-dimensional application specific integrated circuit architecture is described herein. An integrated circuit may include a plurality of dies, with each die having processing and/or other integrated circuit elements. The dies may be coupled together through designated interfaces, such as through silicon vias (TSVs) of each die. The coupling may provide the ability for the components of each die to communicate with components of other dies, while maintaining a short, low-latency, low attenuation connection between the dies. These couplings may allow for each die to be stacked three-dimensionally (e.g., in the thickness of the dies), which may minimize the area footprint of the integrated circuit.

In one aspect, an integrated circuit may include a first die including: a first semiconductor layer: a first plurality of processing elements located on the first semiconductor layer: and a first interface region of the first semiconductor layer, electrically coupled to the first plurality of processing elements and configured to communicate electrical signals with the first plurality of processing elements: a second die including: a second semiconductor layer: a plurality of integrated circuit elements located on the second semiconductor layer: and a second interface region of the second semiconductor layer, electrically coupled to the plurality of integrated circuit elements and configured to communicate the electrical signals to the plurality of integrated circuit elements, where the first interface region and the second interface region are electrically coupled to each other and configured to transmit the electrical signals between the first plurality of processing elements and the plurality of integrated circuit elements.

In some examples the first die is three-dimensionally stacked on the second die by the first die being arranged atop, and electrically connected to, the second die. In some examples, the integrated circuit may include a substrate, wherein the second die is coupled to the substrate and the first die remains free of direct contact with the substrate. In some examples, the integrated circuit may further include a system-on-chip element positioned on the second die and configured to electrically communicate with the first plurality of processing elements and the plurality of integrated circuit elements.

In some cases, the integrated circuit may further include a compact circuit protector positioned on the second die and configured to electrically protect the first die and the second die. In some examples, the first interface region includes a first through silicon via (TSV), and the second interface region includes a second TSV. In some examples, the plurality of integrated circuit elements may include a plurality of memory elements.

In some examples, the plurality of integrated circuit elements may include a second plurality of processing elements. In some examples, the first die and the second die may be configured identically. In some examples, the first plurality of processing elements may include a predetermined quantity of processing elements. In some examples, the integrated may further include a first set of electrical leads electrically coupled to the first interface region and the second interface region and configured to communicate the electrical signals between the first die and the second die. In some examples, the integrated circuit may be an application-specific integrated circuit (ASIC).

In some examples, the integrated circuit may be configured to perform artificial intelligence (AI)/machine learning (ML) functions. In some examples, the first die may further include a third interface region electrically coupled to the first plurality of processing elements and configured to transmit electronic signals to the first plurality of processing elements: where the second die may further include a fourth interface electrically coupled to the plurality of circuit elements and configured to transmit electronic signals to the plurality of processing elements: and the third interface region and the fourth interface region are electrically coupled to each other and are configured to communicate the other electrical signals between the first plurality of processing elements and the plurality of integrated circuit elements. In some examples, the integrated circuit can further include a first set of connection leads electrically coupling the first interface region and the second interface region: and a second set of connection leads electrically coupling the third interface region and the fourth interface region, where the first set of connection leads and the second set of connection leads form a crisscross pattern, a step pattern, or a zigzag pattern.

In some examples, the first interface region may include a first contact pad, and the second interface region includes a second contact pad. In some examples, the first contact pad and the second contact pad may be composed of copper.

In another aspect, a method may include transmitting an electrical signal from a processing element of a first die to a first interface region of the first die: and transferring the electrical signal from the first interface region, via one or more electrical leads, to a second interface region of a second die, where the first die and the second die may form a three-dimensional stacked integrated circuit.

In some examples, the first interface region may include a first TSV region, and the second interface region may include a second TSV region. In some examples, the method may further include transferring the electrical signal from the second interface region to an integrated circuit element of a plurality of integrated circuit elements of the second die. In some examples, the integrated circuit element may include a processing element of a second plurality of processing elements of the second die. In some examples, the integrated circuit element may include a memory element of the second die.

There has thus been outlined, rather broadly, certain embodiments of the present disclosure in order that the detailed description thereof may be better understood, and in order that the present contribution to the art may be better appreciated.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

In order to facilitate a more robust understanding of the application, reference is now made to the accompanying drawings, in which like elements are referenced with like numerals. These drawings should not be construed to limit the application and are intended only to be illustrative.

FIG. 3A and FIG. 3B depict cross-sectional views of a chip or chiplet implementing a three-dimensional architecture according to an example of the present disclosure.

FIG. 4 depicts a process according to an example of the present disclosure.

DETAILED DESCRIPTION

Figure 1:
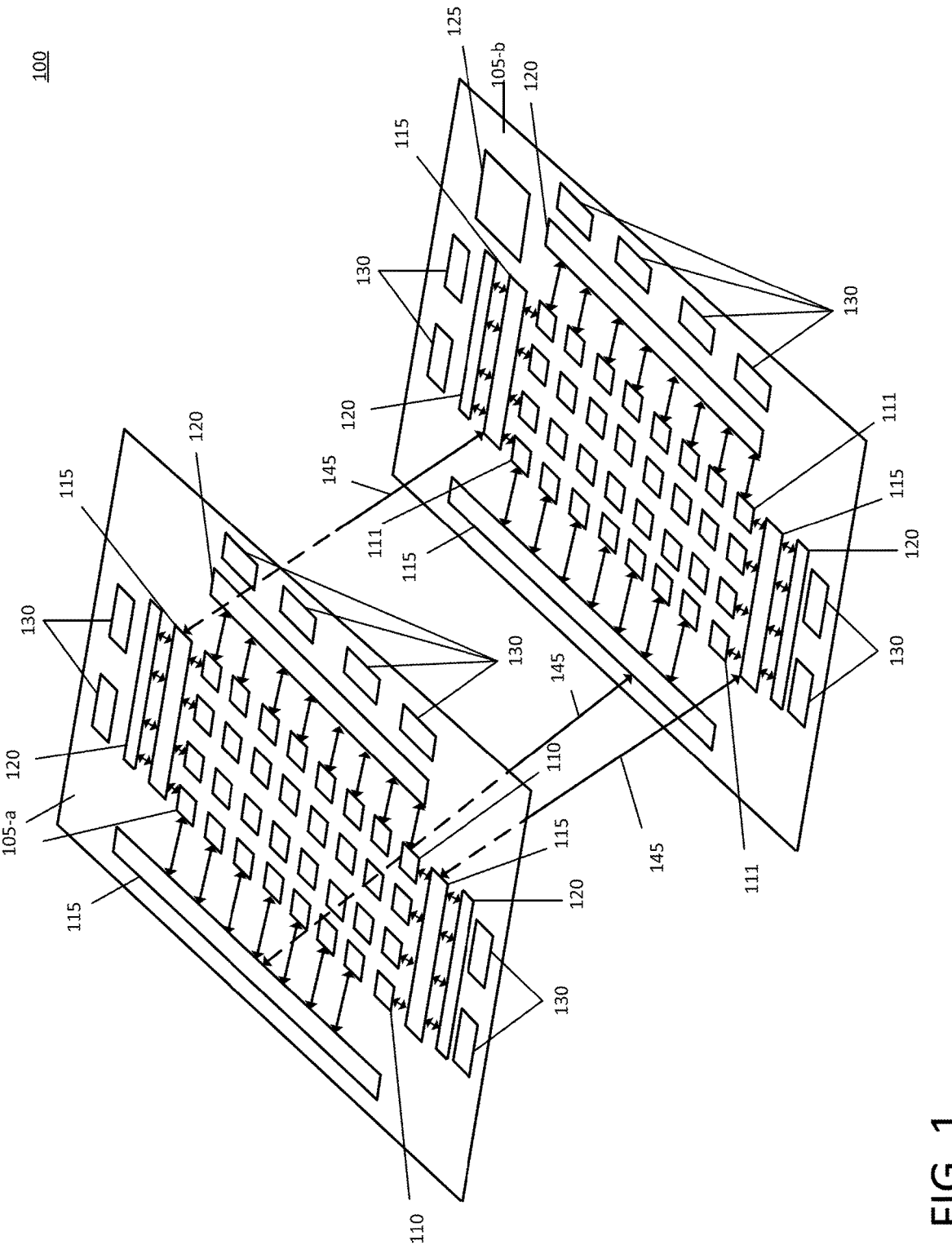
FIG. 1 depicts a chip or chiplet implementing a three-dimensional architecture according to an example of the present disclosure.

A detailed description of the illustrative embodiment will be discussed in reference to various figures, embodiments, and aspects herein. Although this description provides detailed examples of possible implementations, it should be understood that the details are intended to be examples and thus do not limit the scope of the application.

Reference in this specification to "one embodiment," "an embodiment," "one or more embodiments," "an aspect" or the like means that a particular feature, structure, or characteristic described in connection with the embodiment is included in at least one embodiment of the disclosure. Moreover, the term "embodiment" in various places in the specification is not necessarily referring to the same embodiment. That is, various features are described which may be exhibited by some embodiments and not by the other.

It is understood that any or all of the systems, methods and processes described herein may be embodied in the form of computer executable instructions, e.g., program code, stored on a computer-readable storage medium which instructions, when executed by a machine, such as a computer, server, transit device or the like, perform and/or implement the systems, methods and processes described herein. Specifically, any of the steps, operations or functions described above may be implemented in the form of such computer executable instructions. Computer readable storage media includes volatile and nonvolatile, removable, and non-removable media implemented in any method or technology for storage of information, but such computer readable storage media do not include signals. Computer readable storage media may include, but are not limited to, random access memory (RAM), read only memory (ROM), electrically erasable programmable read-only memory (EEPROM), flash memory or other memory technology, compact disc read only memory (CD ROM), digital versatile disks (DVD) or other optical disk storage, magnetic cassettes, magnetic tape, magnetic disk storage or other magnetic storage devices, or any other physical medium which can be used to store the desired information and which may be accessed by a computer.

As defined herein a "computer-readable storage medium," which refers to a non-transitory, physical or tangible storage medium (e.g., volatile or non-volatile memory device), may be differentiated from a "computer-readable transmission medium," which refers to an electromagnetic signal.

Manufacturers may attempt to maximize processing and storage capabilities of an ASIC by including more processing/storage components onto a given chip. There may also be a cost advantage as well, as smaller chip sizes may provide for more dies to be cut or etched from a single wafer. However, ASIC dimensions are typically limited based on the reticle limit, which is the minimum amount of chip surface area that may be exposed during the masking process. Manufacturers may overcome the reticle limit by increasing the width and/or length dimensions of the chip. However, this too may also cause issues, as smaller chip size is preferable in particular technologies (e.g., microelectronics).

According to the present disclosure, a chip or chiplet may include a three-dimensional architecture. The chip or chiplet may be divided into separate dies, where each die may include processing elements (e.g., I/O components) or other chip components (e.g., memory components). The dies may be coupled together via interface regions of each respective die, such as by through silicon vias. Thus, the components of each respective die may communicate with other components of other coupled dies while reducing latency and attenuation. The architecture disclosed herein may allow for three-dimensional stacking of individual dies, while the aggregation of dies may act as a single ASIC (e.g., due to the die couplings). This architecture may thus allow for adding more chip components to a single ASIC, without necessarily expanding the width/length dimensional footprint of the ASIC.

FIG. 1 depicts a chip 100 implementing a three-dimensional architecture according to the present disclosure. The chip 100 may in some cases be a chiplet that may be configured to operate with other chiplets (not shown) to form a chip. In some cases, the chip 100 may be an ASIC. In some examples, the chip 100 may be configured for machine learning and/or artificial intelligence processes. In some other examples, the chip 100 may be configured for other applications (e.g., video transcoding, etc.). The double-arrows depicted in FIGS. 1, 2, 3A, 3B may be electrical connections between particular components or, in the cases of double-arrows between dies, electrical connections between dies of chips 100, 200, and/or 300-*a*, 300-*b*.

The chip 100 may include a first die 105-*a* and a second die 105-*b*. The first and second die 105-*a*, 105-*b* may each be a section of semiconducting material (layer) that may support other components of the chip 100. For example, the dies 105-*a*, 105-*b* may be composed of silicon. In some cases, the dies 105-*a*, 105-*b* may be formed from the same semiconductor wafer (e.g., via cutting or etching), or the dies 105-*a*, 105-*b* may be formed from different wafers, or in some examples different semiconducting materials. The dies 105-*a*, 105-*b* may each form a plane, where each die 105-*a*, 105-*b* may include lengths and widths that are substantially greater than a die thickness. The dies 105-*a*, 105-*b* may be configured to house, include, or contain circuitry component along a given surface.

The first die 105-*a* may be configured to include one or more processing elements 110. The processing elements 110 may be configured to receive a data set(s) and perform distinct process operations on the data(s). For example, a processing element 110 may be configured to perform an arithmetic function (e.g., multiplier, derivation, additive, and/or the like) on the set of data(s). In some examples, a processing element 110 may be configured to perform a logical function (e.g., and, ors, nors, and/or the like) on a set of data(s). In some examples, the processing elements 110 may include functions specific to that processing element 110 (e.g., the processing elements may be distinct from one another). In some examples, the processing elements 110 may receive the data set(s) from a particular circuitry component (e.g., another processing element), process the data, and output the processed results to another particular circuitry component (e.g., another particular circuitry element) to form a processing pipeline. In some examples, the first die 105-*a* may include a predetermined quantity of processing elements 110 (e.g., 32 processing elements 110, 28 processing elements, etc.).

The first die 105-*a* may also include caches 130, such as last level caches (LLCs). The caches may include a temporary storage component which may communicate with other components of the first die 105-*a* (e.g., with processing elements 110). In the example of a LLC, the caches 130 may represent a L2 cache, L3 cache, or L4 cache. In some examples, the caches 130 may be shared across processing elements 110, other components of the first die 105-*a*, and/or components of the second die 105-*b*.

The first die 105-*a* may also include crossbar switches 120. The crossbar switches 120 may interconnect inputs/outputs of circuitry components of the first die 105-*a*. For example, the crossbar switches 120 may include controllable cross-point matrices for switching communication pipelines.

The first die 105-*a* may also include interface regions 115. The interface regions 115 may be configured to electrically couple the first die 105-*a* and the second die 105-*b*. For example, the first die 105-*a* may receive and transmit electrical communications from/to the second die 105-*b* by way of the interface regions 115 of the first die 105-*a* and corresponding interface regions 115 of the second die 105-*b*. By electrically coupling the interface regions 115 of the first die 105-*a* and the second die 105-*b*, the chip 100 may achieve a three-dimensional architecture.

In some examples, the interface regions 115 may be TSV regions, where TSVs may be located in the first die 105-*a*. For example, a TSV may be a cavity defined through the thickness of the first die 105-*a*. A conductive material, such as copper and/or aluminum, may be placed in the cavity, which may be coupled to respective conductive materials or electrical leads to respective interface regions 115 of the second die 105-*b*.

In some cases, the interface regions 115 may include electrical contact pads. The contact pads may be configured to physically contact respective contact pads of the second die 105-*b*. The contact pads may be composed of an electrically conductive material, such as for example copper, aluminum, other metals, and/or the like.

The interface regions 115 may be in different locations than shown in FIG. 1, and/or the number of interface regions 115 be more, or less than, those shown in FIG. 1. For example, the interface regions 115 may be interspersed among the processing elements 110.

The second die 105-*b* may be configured to include one or more circuitry elements 111. The circuitry elements 111 may be various types of circuitry components capable of being implemented with the chip 100. For example, the circuitry elements 111 may be processor elements, such as processing elements 110 of the first die 105-*a*. In some examples, the circuitry elements 111 may be memory components capable of storing data. In the example of FIG. 1, the circuitry components 111 may be processor components 110. In the example chip 200 shown in FIG. 2, the circuitry elements may be memory elements 112 configured to store data (e.g., received from processing elements 110).

In the example of FIG. 1, the circuitry elements 111 may be configured to receive a data set(s) and perform distinct process operations on the data(s). For example, a circuitry element 110 may be configured to perform an arithmetic function (e.g., multiplier, derivation, additive, and/or the like) on the set of data(s). In some examples, a circuitry element 111 may be configured to perform a logical function (e.g., and, ors, nors, and/or the like) on a set of data(s). In some examples, the circuitry element 111 may include functions specific to that circuitry element 111 (e.g., the circuitry elements may be distinct from one another). In some examples, the circuitry elements 111 may receive the data set(s) from another circuitry component, process the data, and/or output the processed data (e.g., processed results) to another particular circuitry component.

The second die 105-*b* may include system-on-chip (SOC) element(s) 125. The SOC element 125 may include various features of a SOC circuit. For example, the SOC may include a central processing unit(s), a graphical processing unit(s), system memory, and/or the like. In some cases, the SOC element 125 may include logic configured to control other processes of the chip 100. For example, the SOC element 125 may include logic allowing the SOC element 125 to instruct other circuitry components of the chip 100 to perform particular functions (e.g., data processing).

The second die 105-*b* may also include other circuitry components similar to the first die 105-*a*, such as chip carriers 130 and crossbar switches 120. As described above, the second die 105-*b* may also include interface regions 115. The interface regions 115 may be configured to electrically couple the second die 105-*b* and the first die 105-*a*. For example, as described above, the second die 105-*b* may receive and/or transmit electrical communications from/to the first die 105-*a* by way of the interface regions 115 of the second die 105-*b* and corresponding interface regions of the first die 115-*a*. In some examples, the interface regions 115 may be TSV regions, where TSVs may be located in the second die 105-*b*. For example, a TSV may be a cavity defined through the thickness of the second die 105-*b*. A conductive material may be placed in the cavity, which may be coupled to respective conductive materials and/or electrical leads to respective interface regions of the first die 105-*a*.

As described above, in some examples, the interface regions 115 may include electrical contact pads. The contact pads may be configured to physically contact respective contact pads of the first die 105-*a*. The contact pads may be composed of an electrically conductive material, such as for example copper, aluminum, other metals, and the like. For example, copper contact pads of each die may couple with respective copper contact pads of another die. In some other cases, metal contact pads of each die may couple with respective metal contact pads of another die. In some cases, these contact pads may include copper to copper or metal to metal bonding.

In some cases, the interface regions 115 may be coupled to one another (e.g., across dies) via electrical leads 145. The electrical leads 145 may be electrically conductive, and may be composed copper, aluminum, other metals, and the like. The electrical leads may electrically couple the first die 105-*a* and the second die 105-*b* via the respective interface regions 115. In some cases, the interface regions 115 may be contact pads coupled to the electrical leads 145.

The interface regions 115 may be in different locations than shown in FIG. 1, and/or the number of interface regions 115 be more, or less than, those shown in FIG. 1. For example, the interface regions 115 may be interspersed among the circuitry elements 111.

While FIG. 1 depicts the first die 105-*a* being atop the second die 105-*b*, in some examples the chip 100 may also include the second die 105-*b* atop the first die 105-*a*, such that the die including the circuitry elements 111 are atop the processing elements 110.

Figure 2:
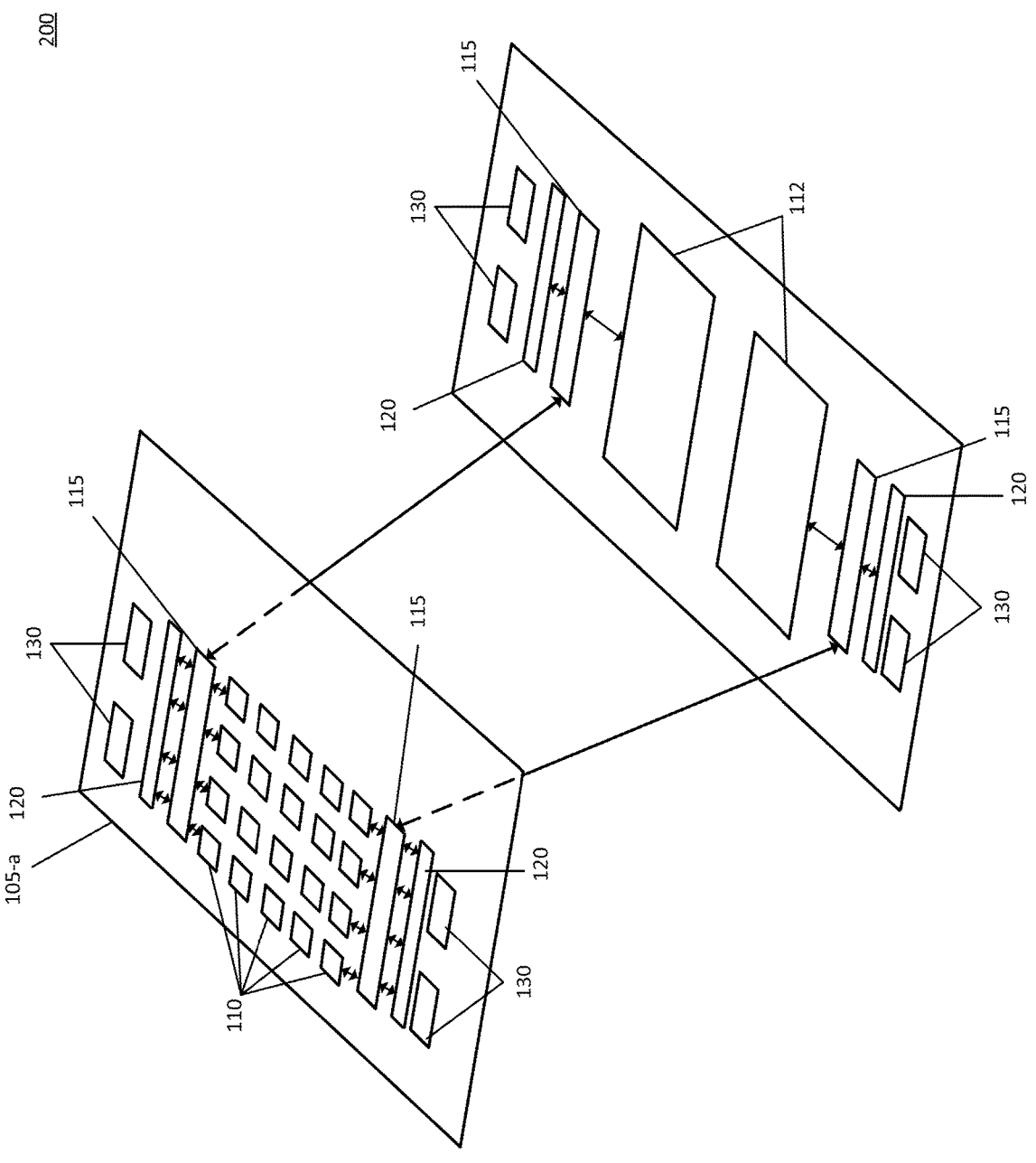
FIG. 2 depicts a chip or chiplet implementing a three-dimensional architecture according to another example of the present disclosure.

FIGS. 3A and 3B depicts a cross-sectional view of a chip or microchip, such as for example chip 100 or chip 200 of FIGS. 1 and 2, respectively. The chip 300-*a*, 300-*b* may include a first die 105-*a* and a second die 105-*b*. The first die 105-*a* may include processing elements 110, and the second die 105-*b* may include circuitry elements 111 discussed with reference to FIG. 1 above. Further, the first die 105-*a* may be positioned such that the first die 105-*a* is atop the second die 105-*b*. By positioning the first die 105-*a* atop the second die 105-*b*, the chip 300-*a*, and/or the chip 300-*b* may achieve a three-dimensional application specific integrated circuit architecture (e.g., a three-dimensional memory integrated circuit architecture). The second die 105-*b* may be positioned atop a substrate 145. In some examples, the substrate 145 may be a packaging substrate, and may protect the chip 300-*a*. 300-*b* from environmental factors, and/or may electrically connect the chip to a printed circuit board (PCB) (not shown). In some examples, an intermediary layer may be positioned between the second die 105-*b* and the substrate 145. For example, a silicon interposer, an organic interposer, a fanout redistribution layer, and/or the like, may be placed between the second die 105-*b* and the substrate 145.

The first die 105-*a* may be electrically coupled to the second die 105-*b* by way of one or more TSVs 140, which may be located in interface regions (e.g., regions 115 of FIG. 1) of the respective dies 105-*a*, 105-*b*. The first die 105-*a* may be positioned such that TSVs of the first die 105-*a* may contact the TSVs of the second die 105-*b* (e.g., where the first die 105-*a* and the second die 105-*b* may be flush to one another). In some examples, electrical leads may be used to couple the TSVs 140 of the first die 105-*a* with the TSVs 140 of the second die 105-*b* (e.g., leads composed of copper, and/or the like). In some examples, the electrical connections may form a crisscross pattern, where the interface region 150-*a* of the second die 105-*b* electrically couples to the interface region 150-*d* of the first die 105-*a*, and the interface region 150-*b* of the second die 105-*b* electrically couples to the interface region 150-*c* of the first die 105-*a* (as depicted in FIG. 3B). In some examples, other electrical connections may form a different pattern(s). For example, the electrical connections may form a step pattern, a zigzag pattern, and/or the like, based on the locations of the respective interface regions that may be desired to be coupled to each other.

Thus, according to the examples of the present disclosure chip dies may be stacked vertically (e.g., in a three-dimensional manner), which may minimize the length/width footprint of the chip (e.g., chips 100, 200, 300-*a*, 300-*b*), and/or may minimize power consumption for the chip. Further, electrical leads, and/or other interfacing between the chip dies (e.g., first die 105-*a*, second die 105-*b*) may provide for low latency and low attenuation of communications sent between the chip dies.

While the chips described with reference to FIGS. 1, 2, 3A and 3B provide particular examples, the disclosure provided herein is not limited to these examples. For example, while FIGS. 1, 2, 3A and 3B depict two dies, in other examples a chip may include two or more dies implementing the architecture described herein. For example, considering FIG. 1, a third die may be stacked atop the first die 105-*a* and electrically connected to the first die through respective interface regions. As described above, this first die 105-*a* may also be electrically connected to the second die 105-*b* through an interface region(s) (e.g., interface region 115). This three-dimensional stacking architecture (which may include the stacking of two or more dies) may enable integration of different functionalities (e.g., cryptography, security input/output (IO), and/or the like) while achieving higher performance. The three-dimensional stacking architecture may also increase memory capacity for a chip. Additionally, in some examples, the various circuitry components of each die may differ compared to those shown in FIGS. 1, 2, 3A, 3B. For example, the number and locations of processing elements 110 and/or circuitry elements 111 of the first die 105-*a* and/or second die 105-*b* may differ. In another example, circuitry elements 111 may include a mix of processing elements and memory elements, and/or the first die 105-*a* may also include memory elements not shown.

FIG. 4 depicts a process 400 according to an example of the present disclosure. The process 400 may be implemented by a chip, such as for example chip 100, chip 200, or chip 300-*a*. 300-*b* of FIGS. 1, 2, 3A, 3B, respectively. At Step 405, an electrical signal from a processing element (e.g., processing element(s) 110) of a first die (e.g., first die 105-*a*) may be transmitted to a first interface region (e.g., interface region 115) of the first die. In some examples, the first interface region may be a TSV region (e.g., TSV 140) of the first die. At Step 410, the electrical signal may be transferred from the first interface region, via one or more electrical leads, to a second interface of a region (e.g., interface region 115) of a second die (e.g., second die 105-*b*), where the first die and second die form a three-dimensional stacked integrated circuit. In some examples, the electrical leads may be electrical conductors of the TSVs of the first die and second die. In some examples, three-dimensional stacking may include placing the first die atop the second die, or vice versa, such that the width/length dimensions of the first die are configured/run parallel to the width/length dimensions of the second die. In some other examples, three-dimensional stacking may also include placing additional dies (e.g., a third die, a fourth die, etc.) atop the first die in which the first die may be atop the second die, or vice versa.

Figure 5:
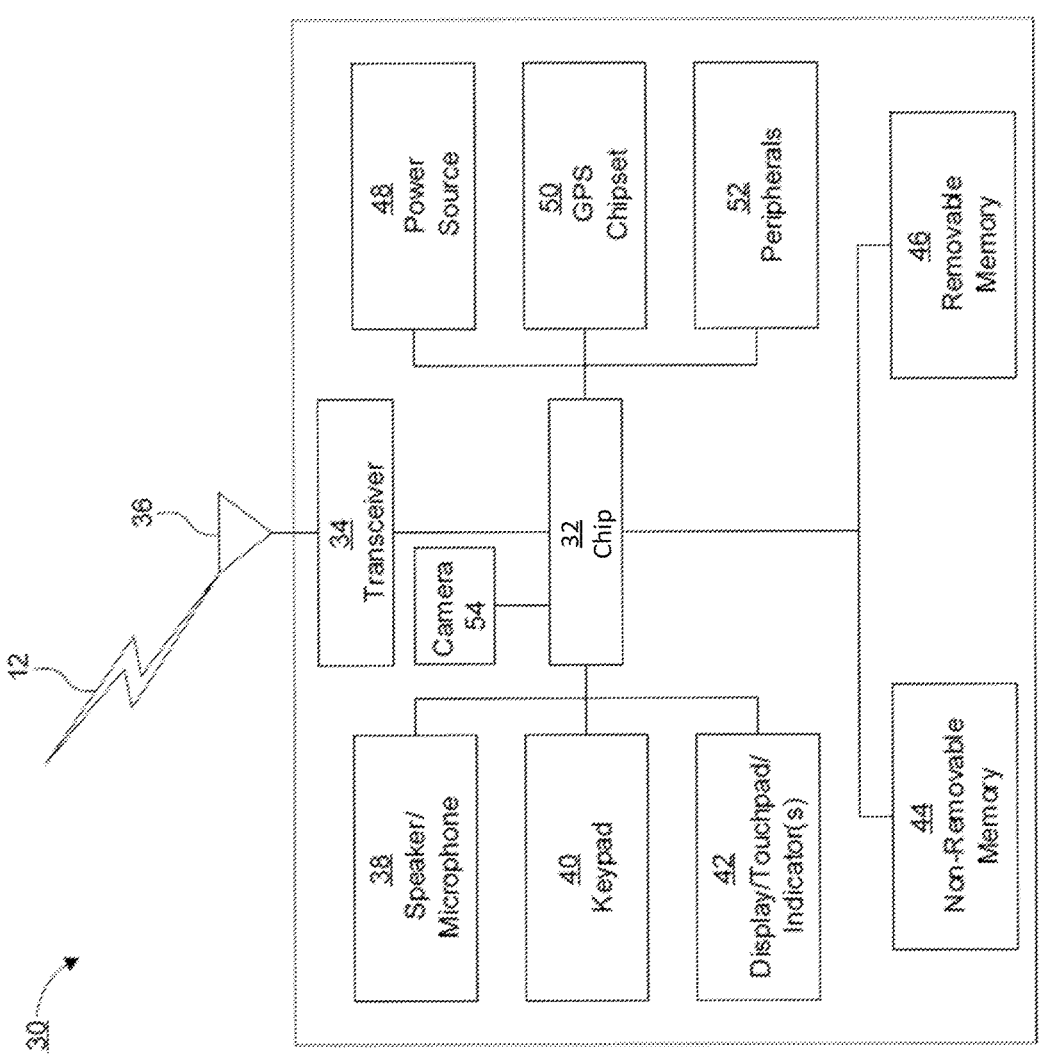
FIG. 5 depicts a device capable of implementing a chip or chiplet according to an example of the present disclosure.

FIG. 5 is a block diagram of an exemplary computing device 30 which may incorporate a chip described herein, such as such as chip 100, chip 200, or chip 300-a, 300-b of FIGS. 1, 2, 3A, 3B. In an example, the computing device 30 may be a server or communication device configured for providing AI/ML functions.

As shown in FIG. 5, the computing device 30 may include a chip 32, non-removable memory 44, removable memory 46, a speaker/microphone 38, a keypad 40, a camera 54, a display/touchpad/indicators 42, a power source 48, a global positioning system (GPS) chipset 50, and other peripherals 52. The computing device 30 may also include communication circuitry, such as a transceiver 34 and a transmit/receive element 36. It will be appreciated the computing device 30 may include any sub-combination of the foregoing elements while remaining consistent with an embodiment.

The chip 32 may be an integrated circuit, and in particular, for example, an ASIC. The chip 32 may be an example of chip 100, chip 200, or chip 300-a, 300-b of FIGS. 1, 2, 3A, 3B. The chip 32 may be capable of various functions designed for the computing device 30. For example, the chip 32 may be configured to perform AI/ML training, to process output from a AI/ML model, inference and video processing, and/or the like. In other examples, the chip 32 may perform other functions or tasks.

In some cases, the chip 32 may execute computer-executable instructions stored in the memory (e.g., memory 44 and/or memory 46) of the computing device 30 in order to perform the various required functions of the computing device 30. For example, the chip 32 may perform signal coding, data processing, power control, input/output processing, and/or any other functionality that enables the computing device 30 to operate in a wireless or wired environment. In some cases, the chip 32 may run application-layer programs (e.g., browsers) and/or radio access-layer (RAN) programs and/or other communications programs. In some cases, the chip 32 may also perform security operations such as authentication, security key agreement, and/or cryptographic operations, such as at the access-layer and/or application layer for example.

The chip 32 may be coupled to communication circuitry (e.g., transceiver 34 and transmit/receive element 36). In some examples, the chip 32, through the execution of computer executable instructions, may control the communication circuitry in order to cause the computing device 30 to communicate with other computing devices via the network to which it is connected.

The transmit/receive element 36 may be configured to transmit signals to, or receive signals from, other computing devices or networking equipment. For example, in an embodiment, the transmit/receive element 36 may be an antenna configured to transmit and/or receive radio frequency (RF) signals. The transmit/receive element 36 may support various networks and air interfaces, such as wireless local area network (WLAN), wireless personal area network (WPAN), cellular, and the like. In yet another embodiment, the transmit/receive element 36 may be configured to transmit and receive both RF and light signals. It will be appreciated that the transmit/receive element 36 may be configured to transmit and/or receive any combination of wireless or wired signals.

The transceiver 34 may be configured to modulate the signals that are to be transmitted by the transmit/receive element 36 and to demodulate the signals that are received by the transmit/receive element 36. As noted above, the computing device 30 may have multi-mode capabilities. Thus, the transceiver 34 may include multiple transceivers for enabling the computing device 30 to communicate via multiple radio access technologies (RATs), such as universal terrestrial radio access (UTRA) and Institute of Electrical and Electronics Engineers (IEEE 802.11), for example.

The chip 32 may access information from, and store data in, any type of suitable memory, such as the non-removable memory 44 and/or the removable memory 46. For example, the chip 32 may store session context in its memory, as described above. The non-removable memory 44 may include RAM, ROM, a hard disk, or any other type of memory storage device. The removable memory 46 may include a subscriber identity module (SIM) card, a memory stick, a secure digital (SD) memory card, and the like. In other embodiments, the chip 32 may access information from, and store data in, memory that is not physically located on the computing device 30, such as on a server or a home computer.

The chip 32 may receive power from the power source 48 and may be configured to distribute and/or control the power to the other components in the computing device 30. The power source 48 may be any suitable device for powering the computing device 30. For example, the power source 48 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The chip 32 may also be coupled to the GPS chipset 50, which may be configured to provide location information (e.g., longitude and latitude) regarding the current location of the computing device 30. It will be appreciated that the computing device 30 may acquire location information by way of any suitable location-determination method while remaining consistent with an exemplary embodiment.

The foregoing description of the embodiments has been presented for the purpose of illustration. It is not intended to be exhaustive or to limit the patent rights to the precise forms disclosed. Persons skilled in the relevant art may appreciate that many modifications and variations are possible in light of the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which may be executed by a computer processor for performing any or all of the steps, operations, or processes described.

Embodiments also may relate to an apparatus for performing the operations herein. This apparatus may be specially constructed for the required purposes, or it may comprise a computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments also may relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed:

1. An integrated circuit comprising:
a first die comprising:
  a first semiconductor layer;
  a first plurality of processing elements located on the first semiconductor layer; and
  a first interface region of the first semiconductor layer comprising a first through silicon via (TSV), electrically coupled to the first plurality of processing elements and configured to communicate electrical signals with the first plurality of processing elements;
a second die comprising:
  a second semiconductor layer;
  a plurality of integrated circuit elements located on the second semiconductor layer; and
  a second interface region of the second semiconductor layer comprising a second TSV, electrically coupled to the plurality of integrated circuit elements and configured to communicate the electrical signals to the plurality of integrated circuit elements, wherein the first TSV and the second TSV are electrically coupled to each other and configured to transmit the electrical signals between the first plurality of processing elements and the plurality of integrated circuit elements.

2. The integrated circuit of claim 1, wherein the first die is three-dimensionally stacked on the second die by the first die being arranged atop, and electrically connected to, the second die.

3. The integrated circuit of claim 1, further comprising:
a substrate, wherein the second die is coupled to the substrate and the first die remains free of direct contact with the substrate.

4. The integrated circuit of claim 1, further comprising:
a system-on-chip element positioned on the second die and configured to electrically communicate with the first plurality of processing elements and the plurality of integrated circuit elements.

5. The integrated circuit of claim 1, further comprising:
a compact circuit protector positioned on the second die and configured to electrically protect the first die and the second die.

6. The integrated circuit of claim 1, wherein the plurality of integrated circuit elements comprises a plurality of memory elements.

7. The integrated circuit of claim 1, wherein the plurality of integrated circuit elements comprises a second plurality of processing elements.

8. The integrated circuit of claim 1, wherein the first die and the second die are configured identically.

9. The integrated circuit of claim 1, wherein the first plurality of processing elements comprises a predetermined quantity of processing elements.

10. The integrated circuit of claim 1, further comprising a first set of electrical leads electrically coupled to the first interface region and the second interface region and configured to communicate the electrical signals between the first die and the second die.

11. The integrated circuit of claim 1, wherein the integrated circuit comprises an application-specific integrated circuit (ASIC).

12. The integrated circuit of claim 1, wherein the integrated circuit is configured to perform artificial intelligence (AI) or machine learning (ML) functions.

13. The integrated circuit of claim 1, wherein:
the first die further comprises a third interface region electrically coupled to the first plurality of processing elements and configured to communicate other electrical signals with the first plurality of processing elements;
the second die further comprises a fourth interface region electrically coupled to the plurality of integrated circuit elements and configured to communicate the other electrical signals with the second plurality of processing elements; and
the third interface region and the fourth interface region are electrically coupled to each other and are configured to communicate the other electrical signals between the first plurality of processing elements and the plurality of integrated circuit elements.

14. The integrated circuit of claim 13, further comprising:
a first set of connection leads electrically coupling the first interface region and the second interface region; and
a second set of connection leads electrically coupling the third interface region and the fourth interface region, wherein the first set of connection leads and the second set of connection leads form a crisscross pattern, a step pattern, or a zigzag pattern.

15. The integrated circuit of claim 1, wherein the first interface region comprises a first contact pad, and the second interface region comprises a second contact pad.

16. The integrated circuit of claim 15, wherein the first contact pad and the second contact pad are composed of copper.

* * * * *